US008462890B2

(12) United States Patent
Stewart et al.

(10) Patent No.: US 8,462,890 B2
(45) Date of Patent: Jun. 11, 2013

(54) APPARATUS AND METHODS FOR JOINTLY DECODING MESSAGES BASED ON APRIORI KNOWLEDGE OF MODIFIED CODEWORD TRANSMISSION

(75) Inventors: Kenneth A. Stewart, Grayslake, IL (US); Michael E. Buckley, Grayslake, IL (US); Olivier Peyrusse, Toulouse (FR); Jeffrey C Smolinske, Schaumburg, IL (US)

(73) Assignee: Motorola Mobility LLC, Libertyville, IL (US)

( * ) Notice: Subject to any disclaimer, the term of this patent is extended or adjusted under 35 U.S.C. 154(b) by 721 days.

(21) Appl. No.: 12/178,287

(22) Filed: Jul. 23, 2008

(65) Prior Publication Data

US 2008/0279312 A1   Nov. 13, 2008

(30) Foreign Application Priority Data

Jan. 23, 2006 (EP) .................................... 06300059

(51) Int. Cl.
*H04L 27/06* (2006.01)
(52) U.S. Cl.
USPC ............ 375/340; 375/147; 375/324; 375/341
(58) Field of Classification Search
USPC ................... 375/340, 147, 324, 341; 329/300, 329/311, 304; 341/126; 455/130
See application file for complete search history.

(56) References Cited

U.S. PATENT DOCUMENTS

| | | | |
|---|---|---|---|
| 5,319,712 A | 6/1994 | Finkelstein et al. | |
| 6,067,444 A | 5/2000 | Cannon et al. | |
| 6,097,772 A | 8/2000 | Johnson et al. | |
| 6,360,345 B1 | 3/2002 | Kim et al. | |
| 6,392,572 B1 | 5/2002 | Shiu et al. | |
| 6,782,035 B1 | 8/2004 | Nakamura et al. | |
| 6,788,959 B2 | 9/2004 | Jokinen et al. | |
| 7,058,407 B2 | 6/2006 | Chi et al. | |
| 7,243,285 B2 | 7/2007 | Foisy et al. | |

(Continued)

FOREIGN PATENT DOCUMENTS

| | | |
|---|---|---|
| EP | 1811674 A1 | 7/2007 |
| EP | 1811711 A1 | 7/2007 |

(Continued)

OTHER PUBLICATIONS

Public Email Discussion Forum: 3GPP_TSG_RAN_WG1©LIST. ETSI.ORG, Discussion Group; Chmiel, M. Jun. 11, 2007 8:49 AM.

(Continued)

*Primary Examiner* — Dhaval Patel

(57) ABSTRACT

A method and apparatus for jointly decoding a first and second message is disclosed. The signaling scenario illustrated by FIG. 1 and using the codeword properties defined herein, the various embodiments may combine multiple messages under the hypothesis that the value of a message portion corresponding any subsequent observed transmission is different. Accordingly a first buffer may store the first observed message frame (509) and a second buffer may sum the LLR's of subsequent observed frames (513).

In the embodiments disclosed, two decoding hypotheses are required only; a first where the two buffers are combined directly (513) and a second where the difference codeword bit LLR's of the first buffer (509) are inverted before combining with those of the second buffer (519). A maximum of N transmissions is allowed by the receiver (523), after which a decoding failure is declared.

19 Claims, 7 Drawing Sheets

U.S. PATENT DOCUMENTS

| | | | |
|---|---|---|---|
| 7,260,764 | B2 | 8/2007 | Chen |
| 7,321,643 | B2 * | 1/2008 | Chang et al. ............... 375/341 |
| 7,453,907 | B2 | 11/2008 | Jonsson et al. |
| 7,593,489 | B2 * | 9/2009 | Koshy et al. ............... 375/340 |
| 7,600,172 | B2 * | 10/2009 | Berens et al. ............... 714/751 |
| 7,711,068 | B2 | 5/2010 | Shokrollahi et al. |
| 7,813,453 | B2 * | 10/2010 | Khandekar et al. ........... 375/340 |
| 7,899,051 | B2 | 3/2011 | Bachu et al. |
| 8,189,581 | B2 | 5/2012 | Bachu et al. |
| 2001/0014858 | A1 | 8/2001 | Hirayama |
| 2002/0056064 | A1 | 5/2002 | Kidorf et al. |
| 2002/0159545 | A1 * | 10/2002 | Ramesh et al. ............... 375/340 |
| 2002/0172261 | A1 | 11/2002 | Hershey et al. |
| 2002/0186778 | A1 * | 12/2002 | Agami et al. ............... 375/261 |
| 2003/0039217 | A1 | 2/2003 | Seo et al. |
| 2003/0072286 | A1 * | 4/2003 | Kim et al. ............... 370/335 |
| 2003/0112780 | A1 | 6/2003 | Ouyang et al. |
| 2003/0118031 | A1 | 6/2003 | Classon et al. |
| 2004/0179469 | A1 | 9/2004 | Attar et al. |
| 2004/0225940 | A1 | 11/2004 | Kerr et al. |
| 2005/0003831 | A1 | 1/2005 | Anderson |
| 2005/0030914 | A1 * | 2/2005 | Binzel et al. ............... 370/312 |
| 2005/0030964 | A1 | 2/2005 | Tiedemann, Jr. et al. |
| 2005/0276249 | A1 | 12/2005 | Damnjanovic et al. |
| 2005/0276266 | A1 | 12/2005 | Terry |
| 2006/0040706 | A1 | 2/2006 | Wu et al. |
| 2006/0193348 | A1 | 8/2006 | Unno et al. |
| 2006/0256792 | A1 | 11/2006 | Kwong et al. |
| 2007/0042794 | A1 | 2/2007 | Fischer |
| 2008/0039133 | A1 | 2/2008 | Ma et al. |
| 2008/0072269 | A1 | 3/2008 | Malladi et al. |
| 2008/0181163 | A1 | 7/2008 | Ye et al. |
| 2008/0186885 | A1 | 8/2008 | Athalye et al. |
| 2008/0294962 | A1 | 11/2008 | Goel |
| 2008/0316995 | A1 | 12/2008 | Bachu et al. |
| 2008/0320527 | A1 | 12/2008 | Bachu et al. |
| 2009/0149207 | A1 | 6/2009 | Zhang et al. |
| 2009/0168927 | A1 | 7/2009 | Bachu et al. |

FOREIGN PATENT DOCUMENTS

| | | |
|---|---|---|
| GB | 2418571 A | 3/2006 |
| JP | 2006014365 | 1/2006 |
| WO | 9825360 A | 6/1998 |
| WO | 9927745 A | 6/1999 |
| WO | 0062467 A | 10/2000 |
| WO | 2007087511 A2 | 8/2007 |
| WO | 2007087512 A2 | 8/2007 |
| WO | 2008000292 A1 | 1/2008 |

OTHER PUBLICATIONS

Annamalai A et al: "Analysis of Unslotted Direct-Sequence Spread Spectrum Multiple Access Network with Packet combining" XP006007997, pp. 1673-1674.

Miyagi M et al: "Selective Repeat Type-II Hybrid Fec/ARG Systems Using Concatenated Codes" XP000425130, pp. 25-34.

3GPP TS 44.006 V6.2.0; Nov. 2005; 59 Pages.

3GPP TS 44.005 V7.0.0; Nov. 2005; 32 Pages.

Sanderovich et al., LDPC Coded MIMO Multiple Access With Iterative Joint Decoding, IEEE Transactions on Information Theory, vol. 51, No. 4, Apr. 2005, pp. 1437-1450.

The State Intellectual Property Office of the People's Republic of China, China Patent Appln. No. 200880021002.1, Sep. 15, 2011, 10 pages.

3GPP TS 45.003 v6.8.0 (Sep. 2005) 3rd Generation Partnership Project; Technical Specification Group GSM/EDGE, Radio Access Network, Channel coding (Release 6) 202 pages.

Japanese Patent Office, "Office Action" (in Japanese) Japanese Pat Appln. No. 2010-51056 , Nov. 22, 2011, 3 pages.

3GPP TSG-GERAN Meeting #25, GP-015429 Jun. 20-24, 2005.

3GPP TS 44.0.05 V7.0.0; Nov. 2005; 32 pages.

3GPP TS 44.0.06 V6.2.0; Nov. 2005; 59 pages.

Motorola: "R2-061459 System Broadcast" Internet Citation May 3, 2006.

Public Email Discussion Forum: 3GPP_TSG_RAN_WG1©LIST.ETSI.ORG, Discussion Group; Chmiel, M. Jun. 11,2007 8:49 AM.

Public Email Discussion Forum: 3GPP_TSG_RAN_WG1©LIST.ETSI.ORG, Discussion Group; Buckley, M. Jun. 11, 2007 8:47 PM.

Public Email Discussion Forum: 3GPP_TSG_RAN_WG1©LIST.ETSI.ORG, Discussion Group; Shiego, T. Jun. 12, 2007 10:19 PM.

Public Email Discussion Forum: 3GPP_TSG_RAN_WG1©LIST.ETSI.ORG, Discussion Group; Jianglei, M. Jun. 13, 2007 8:35 AM.

Public Email Discussion Forum: 3GPP_TSG_RAN_WG1©LIST.ETSI.ORG, Discussion Group; Dahlman, E. Jun. 13, 2007 9:27 AM.

Public Email Discussion Forum: 3GPP_TSG_RAN_WG1©LIST.ETSI.ORG, Discussion Group; Jianglei, M. Jun. 14, 2007 3:53 PM.

Public Email Discussion Forum: 3GPP_TSG_RAN_WG1©LIST.ETSI.ORG, Discussion Group; Onggosanusi, E Jun. 15, 2007 12:39 AM.

Public Email Discussion Forum: 3GPP_TSG_RAN_WG1©LIST.ETSI.ORG, Discussion Group; Chmiel, M. Jun. 15, 2007 2:12 AM.

Public Email Discussion Forum: 3GPP_TSG_RAN_WG1©LIST.ETSI.ORG, Discussion Group; Joonyoung, C. Jun. 18, 2007 7:07 AM.

Annamalai A et al: "Analysis of Unslotted Direct-Sequence Spread Spectrum Multiple Access Network with Packet combining" XP006007997, pp. 1673-1674, Sep. 25, 1997 vol. 22 No. 20.

Miyagi M et al: "Selective Repeat Type-II Hybrid Fec/ARG Systems Using Concatenated Codes" XP000425130, pp. 25-34, electronic and communications in Japan, Part I, vol. 76, No. 6, 1993.

3GPP TS 25.212 V6.7.0, Dec. 2005; 84 pages.

3GPP TSG RAN WG1 #49 Meeting, Kobe, Japan, May 7-11, 2007 R1-072265.

IEEE Transactions on Information Theory, vol. IT-13, No. 2, Apr. 1967.

United States Patent and Trademark Office, "Non-Final Office Action" for U.S. Appl. No. 11/765,909 dated Sep. 3, 2010, 13 pages.

United States Patent and Trademark Office, "Final Office Action" for U.S. Appl. No. 11/765,909 dated Mar. 18, 2011, 14 pages.

United States Patent and Trademark Office. "Notice of Allowance" for U.S. Appl. No. 11/967,971 dated Oct. 19, 2010, 7 pages.

3GPP TSG-GERAN Meeting #25, GP-051429, Jun. 20-24, 2005.

* cited by examiner

| 8 | 7 | 6 | 5 | 4 | 3 | 2 | 1 | |
|---|---|---|---|---|---|---|---|---|
| SPARE=0 | LPD = 0 0 | | | SAPI = 0 0 0 | | C/R | EA=1 | BIT NUMBER (201) ADDRESS FIELD (203) |
| N(R) | | | P | N(S) | | | 0 | CONTROL FIELD (205) |
| LENGTH | | | | | | M | EL=1 | LENGTH INDICATOR (207) |
| L3 MESSAGE + FILL BITS (0 TO 20 OCTETS) | | | | | | | | (209) |
| | | | | | | | | |
| | | | | | | | | |

*FIG. 2*

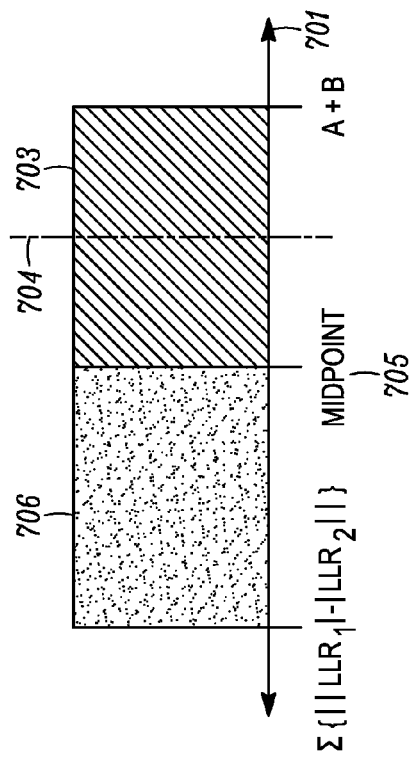
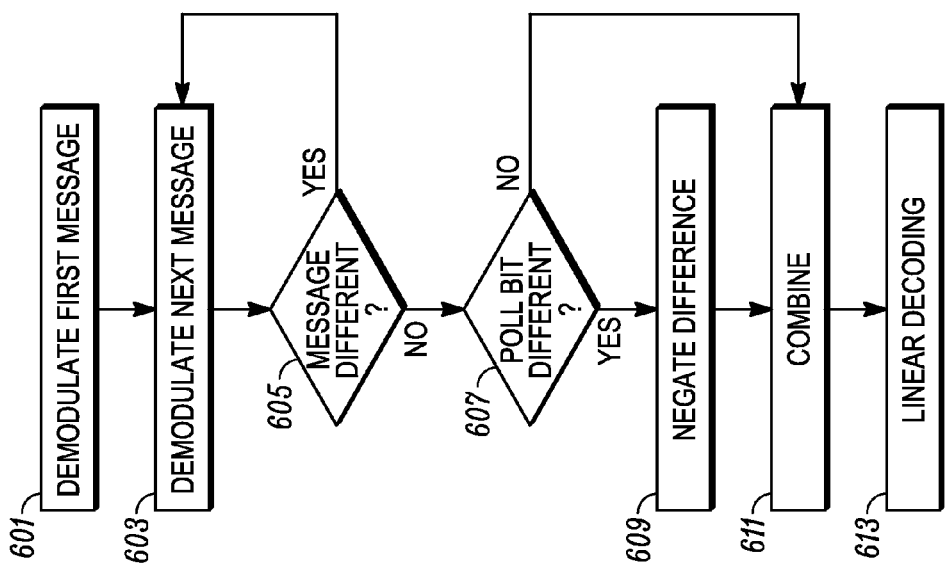

APPARATUS AND METHODS FOR JOINTLY DECODING MESSAGES BASED ON APRIORI KNOWLEDGE OF MODIFIED CODEWORD TRANSMISSION

FIELD OF THE DISCLOSURE

The present disclosure relates generally to wireless communications systems receivers and more particularly to apparatuses and methods for communications channel decoding.

BACKGROUND OF THE DISCLOSURE

Mobile wireless communications systems generally require the capability of handovers between base station transceivers. However, such handovers have traditionally created technical issues resulting in dropped calls during the handover process.

One such issue with respect to GSM networks is that of maintaining control channel integrity when using low-rate Advanced Multi-rate Codec (AMR) modes, half-rate traffic channel modes, or indeed for many other logical traffic channels. For example, when operating using the full-rate AMR 5.9 bps or 4.74 kbps speech encoder modes, as well as half-rate or other modes as mentioned above, the carrier-to-interference plus noise ratio (CINR) required to maintain an acceptable frame error rate (FER) on the traffic channel (TCH) may be significantly less than the CINR required to maintain the control channel FER. Example control channels include, but are not limited to, the Slow Associated Control Channel (SACCH) and the Fast Associated Control Channel (FACCH) as specified in the GSM 3GPP specifications, among other various control channels.

Because control channel reception is critical for certain operations such as handovers, the control channel error rate is of particular importance for reducing the network dropped call rate (DCR).

It would be desirable to combine multiple control channel transmissions by for example Chase combining. However, if any bit or bits change between subsequent transmissions, the codeword resulting from forward error correction (FEC) coding methods, such as the combination of Fire coding and convolutional coding in the case of the GSM FACCH, would also change and direct combining of control channel blocks would not be possible.

One potential solution, which could be applied to the FACCH, would be to permit re-transmission of an identical message, thereby permitting the Mobile Station (MS) to combine the first and second transmissions. However, such a method presents several additional issues.

First, the method requires that the 184-bit payload (Layer 2 or "L2" message) of the first and second FACCH transmissions be exactly identical to permit Chase combining at the receiver. No modification whatsoever of the FACCH message content could be permitted.

Second, in order to permit the receiver to combine the appropriate control messages, some means of implicit or explicit signaling would need to be provided to instruct that combining should be performed. For example, the time between the first and second transmission of the FACCH frame could be an exact number, or otherwise known number, of TDMA frames.

Third, the method could only be used to combine a known limited number of FACCH transmissions. Flexible support for the Chase combining of many FACCH transmissions would prove impractical. Finally, the method could not be supported by legacy networks or provide significant advantage to legacy terminals.

BRIEF DESCRIPTION OF THE DRAWINGS

FIG. 2 is a bit map diagram illustrating a message frame structure.

FIG. 6 is a flow diagram illustrating high level operation in accordance with the various embodiments of FIG. 5.

FIG. 7 is a mathematical coordinate plot of array sums illustrating use of log likelihood ratios to determine whether there is a difference in codewords or a certain bit in accordance with various embodiments.

DETAILED DESCRIPTION

Methods and apparatuses for jointly decoding messages are provided herein.

In the various embodiments, messages may be jointly decoded based on a priori known differences between initial and subsequent messages, without regard to timing or spacing between initial and subsequent messages as further described herein.

In some of the embodiments, the properties of Soft-Input, Soft-Output (SISO) decoders may be utilized for the purpose of handling and combining initial messages with subsequent messages having a priori known differences.

Further in other embodiments, the linear properties of Fire codes and convolutional codes are utilized along with a priori known differences between subsequent message transmissions such that various combining techniques may be effectively employed. In such embodiments, advantageous use is made of the linearity of the message encoding such that if a difference in subsequent message transmission is known, then a difference in codewords is also known.

If a difference between codewords is known then log likelihood ratios corresponding to the difference may be negated such that previous and subsequent channel blocks may be combined directly in the various embodiments. The various embodiments therefore enable Chase combining for signaling information that is not fully repeated.

In the various embodiments, upon receiving a first message transmission a mobile station may first attempt a general message decode without attempting to combine prior message transmissions.

If the decoding fails, the mobile station may hypothesize the message, and combine the soft decision information made available by the current and previous message frame observations consistent with the hypothesis. The soft-combining methods used by the mobile station depend on the bits that change between each hypothesized message retransmission.

If a successful message decode does not result from the first hypothesis, the mobile station may proceed to hypothesize the next message and so on up to N message transmissions. The mobile station may update the stored message soft decision information before each decode attempt.

Figure 1:
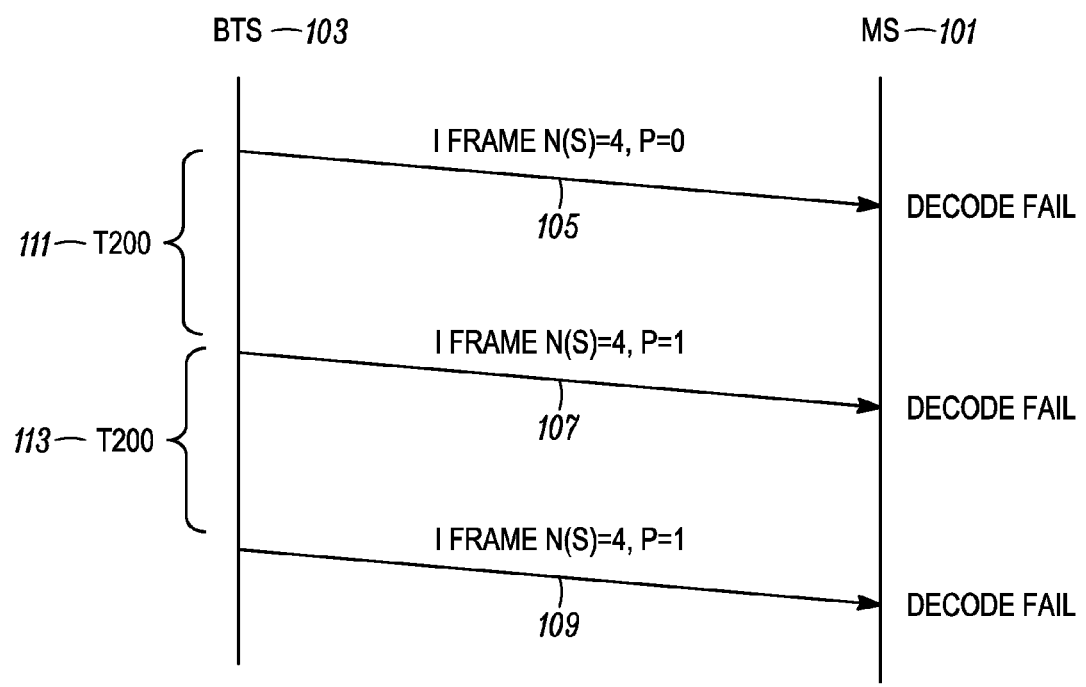
FIG. 1 is a messaging signal flow diagram illustrating a signaling scenario.

Turning now to the drawings wherein like numerals represent like components, FIG. 1 is a messaging diagram illustrating the transmission of information transfer frames ("I-frames") 105, 107, 109 from a Base Transceiver Station (BTS) 103 to a mobile station (MS) 101.

The various embodiments utilize the repetition of the Layer 2 (L2) and Layer 3 (L3) content known to occur during specific message transfer sequences on the Fast Associated Control Channel (FACCH). FIG. 1 therefore illustrates a signaling scenario which may be utilized to advantage by the various embodiments herein disclosed.

The illustrated signaling scenario is a typical downlink message transfer from the BTS 103 to the MS 101, in which an L3 message is carried in an L2 Information (I) frame. The precise content of the L3 message is not significant therefore the L3 message may be a handover command or any other signaling message of interest.

It is critically important to note that while the various embodiments herein disclosed are described in the context of a GSM FACCH, the embodiments are not so limited. Rather, any signaling scenario in which re-transmission is used may enjoy the benefits of the various embodiments herein disclosed. Further, the various embodiments may be applied to any wireless communications standard or air interface such as, but not limited to, GSM/GPRS/EDGE, UMTS, IEEE 802.16, IEEE 802.20, IEEE 802.11 etc.

Returning now to FIG. 1, and the illustrated signaling scenario, a first I frame 105 containing an L3 message is sent from the BTS 103 to the MS 101. I-frame 105 also contains a Poll/Final bit which is contained in command frames as well as response frames. For command frames, the Poll bit is referred to as a "P bit" while in response frames it is referred to as an "F bit." For the various embodiments, the P bit of a command frame is the bit of concern.

In the initial I-frame 105, the P bit is set to value 0 and a send sequence number N(S), also contained within the I-frame 105, has an arbitrary value depending upon how many I frames have previously been transferred from the BTS 103 to the MS 101.

In the example illustrated by FIG. 1, N(S) is shown to have the value 4. A receive sequence number N(R), also contained in the I-frame, will also have an arbitrary value. This value is assumed not to change during the signaling scenario illustrated by FIG. 1. The retransmission of the I-frame, as illustrated by FIG. 1, has a high probability of occurrence, however it depends upon whether or not I-frames are successfully transferred in the uplink, from MS 101 to BTS 103, during the illustrated scenario. With respect to FIG. 1, it is assumed that no I-frames are received by BTS 103 from MS 101 on the uplink.

As shown in FIG. 1, the MS 101 receives the first transmission of the I-frame 105 and attempts to decode it but is unsuccessful. Because the BTS 103 receives no acknowledgement of the I-frame, and after a timer "T200" 111 expires, the BTS 103 will retransmit the I-frame 107, with the same L3 content and the same L2 header. However, the P bit will be set to 1.

Further in FIG. 1, the MS 101 also fails to decode the second I-frame 107. After timer T200, 113, expires a second time, the BTS 103 sends the I frame 109 a third time, again with the P bit set to value 1. The MS 101 again fails to decode the I-frame. If the MS 101 continues to fail decoding I frames on the downlink, re-transmissions may continue for a total of 34 I frame retransmissions, or 29 for half-rate traffic channel (TCH), at which point the call is dropped by the BTS 103.

FIG. 2 is a bit map illustrating an I-frame structure in accordance with the 3GPP standards. In FIG. 2, row 201 indicates a bit position number with descending rows corresponding in general to octets. The I-frame general format comprises an address field 203, control field 205, length indicator field 207, and an L3 message 209. It is to be understood that FIG. 2 is for general illustration only and that fields may be modified, for example fields may be longer than one octet, and still remain in accordance with the various embodiments.

In FIG. 2, address field 203 further comprises a spare bit, bit 8, which has the value 0. Address field 203 also comprises a Link Protocol Discriminator (LPD) which for a FACCH always has the value 00. Further with respect to a FACCH, a Service Access Point Identifier (SAPI) of address field 203 will always have the value 000. A Command/Response (C/R) bit of address field 203 indicates whether the frame is a command or a response. For example, in the signaling scenario illustrated by FIG. 1, for a BTS 103 command to the MS 101 the C/R bit value would be set to 1. The address extension (EA) field, which is bit position 1 of address field 203, is set to 1 to indicate that there is no extension to the address field 203.

The Control field 205 further comprises a send sequence number N(S) field and a receive sequence number N(R) field. The N(S) and N(R) fields are 3 bit sequence numbers and may have any appropriate value. The Poll bit (P bit), which is bit position 5 of the control field 205, is 0 on an initial transmission of an I-frame and is set to 1 on all retransmissions of the same I frame as previously discussed above.

The length indicator field 207 indicates the size of the Layer 3 message 209. Bit position 2, of length indicator field 207, which is defined as the "More bit" (M bit) indicates whether the current L2 block is the last block or whether more L2 blocks follow and need to be concatenated to form the full L3 message. An M bit set to 1 indicates that more L2 blocks follow. The Length Extension (EL) bit, of length indication field 207, is always 1 on the FACCH. The Layer 3 message follows the length octet. Any unused octets are filled with the hexadecimal value 2B.

Figure 3:
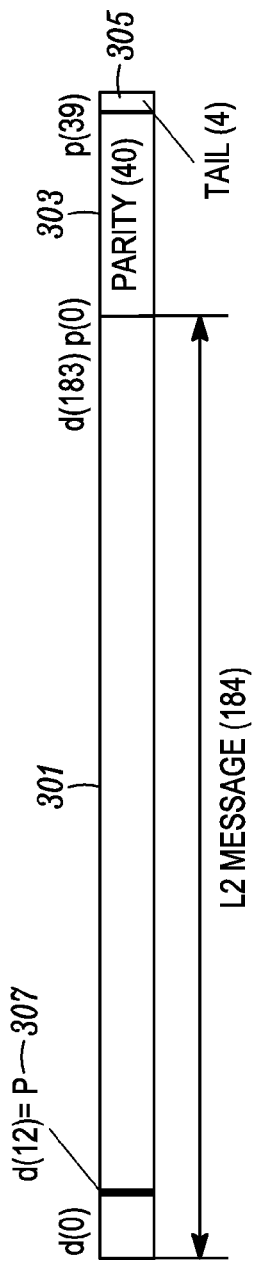
FIG. 3 is a bit map diagram illustrating a mapping of a control signal on a 184-bit L1 message payload.

Turning now to FIG. 3, a bit mapping of FACCH content on an L1 payload is illustrated. The 184-bit L2 FACCH information sequence is read into the 184-bit field 301, d(0) . . . d(183), and then processed by a 40-bit Fire code. The 184-bit field 301 d(0) . . . d(183) is subject to a 40-bit systematic Fire code, resulting in the 40 bit parity field 303 p(0) . . . p(39) appended to d(0) . . . d(183) as illustrated in FIG. 3. The zero-valued tail bits 305 are used to terminate the rate-½ convolutional code applied to the L1 FACCH block.

In the various embodiments, a specific sequence of L2 information messages may be hypothesized for a signaling scenario as illustrated in FIG. 1. In an embodiment in which the signaling scenario of FIG. 1 is a FACCH transmission, the primary distinction between a first FACCH transmission of the L2 message, and any subsequent transmission of the same message is the change in the P bit value from P=0 for the first transmission to P=1 for any subsequent transmissions. Note that a retransmission may be identified by the sequence number N(S) which will be identical for the first and any subsequent transmissions.

Returning to FIG. 3, the P bit 307 occupies bit 5 of octet 2, and is therefore located at bit index $Idx_P=(Octet\#-1)\times 8+(Bit\#-1)$ or $Idx_P=(2-1)\times 8+(5-1)=12$ in the L2 information sequence 301, d(0) . . . d(183), as shown in FIG. 3.

Figure 4:
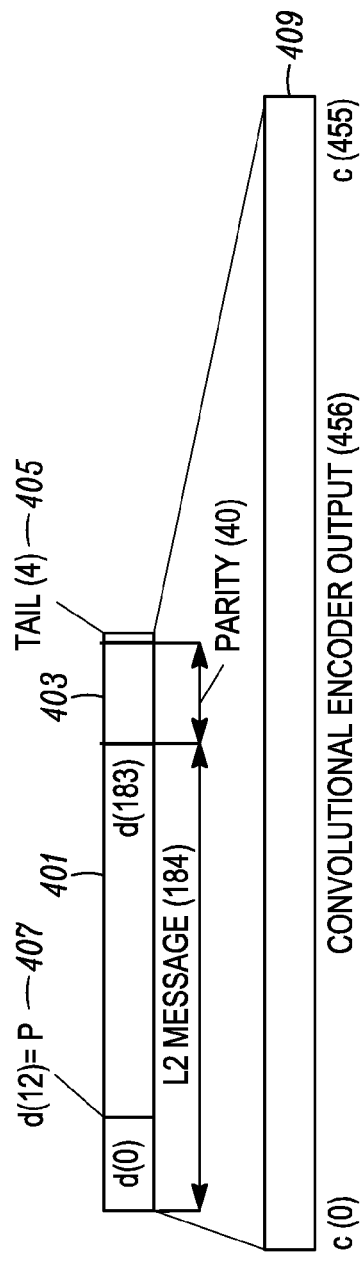
FIG. 4 is a bit map diagram illustrating a concatenated coding scheme.

Critically important to the various embodiments, the combination of a rate-½ convolutional code and a Fire code forms a concatenated code which is linear in binary Galois Field GF(2) as illustrated in FIG. 4.

Therefore, with respect to FIG. 4, if the L2 information sequence is $d(x)=d(0)+ \ldots +d(183)x^{183}$ (in binary Galois Field GF(2)) then the encoded sequence $c(x)=c(0)+ \ldots + c(183)x^{455}$ may be expressed as:

$$c(x)=f(d(x))=Md(x) \quad (0.1)$$

where the function $f(\bullet)$ is a linear operator, equivalently expressed by the matrix operator M.

Therefore an information sequence d(x) may be decomposed into:

$$d(x)=d_o(x)+Px^{12} \quad (0.2)$$

where the polynomial $d_o(x)$ has no term of order 12 (i.e. O(12)). Because $f(\bullet)$ is a linear operator, the codeword polynomial c(x) may be expressed as:

$$\begin{aligned} c(x) &= f(d_o(x)+Px^{12}) \\ &= f(d_o(x))+f(Px^{12}) \\ &= c_o(x)+p(x) \end{aligned} \quad (0.3)$$

where $c_o(x)$ is the codeword excluding the P bit, referred to hereinafter as the basic codeword, and p(x) is the codeword corresponding to the P bit.

The received codeword polynomial c(x) for each possible value of P can then be expressed as:

$$c(x) = \begin{cases} c_o(x) & P=0 \\ c_o(x)+p(x) & P=1 \end{cases} \quad (0.4)$$

In the various embodiments, Equation (0.4) enables combining a first and any subsequent transmissions under the signaling scenario illustrated in FIG. 1. Specifically, denote the 456 log-likelihood ratio (LLR) values delivered by the equalizer for the i-th observation of the message as $LLR_k^i$ for $i \geq 0$ and $k=\{0, \ldots, 455\}$. Taking P=0 as an arbitrary reference case, if the hypothesized value of P associated with the i-th observation of the message is $H_P^i=0$, then $LLR_k^i$ is unmodified before combining or further processing. If $H_P^i=1$, then $LLR_k^i$ is arithmetically inverted, i.e. $LLR_k^i \to -LLR_k^i$, for all polynomial terms in k for which p(x)=1, and so on.

More importantly, knowledge of the exact value of P may be relaxed during combining of subsequent transmissions to the assumption that either a) the value of P corresponding to $LLR_k^i$ for i=0 is different from the value of P corresponding to $LLR_k^i$ for i>0, or b) it is the same. Equation (0.4) enables the combining under either hypothesis.

Returning again briefly to the signaling scenario illustrated by FIG. 1 and using the codeword properties defined previously above, it is possible in the various embodiments to combine multiple FACCH messages under the hypothesis that the value of the P bit corresponding to the first and any subsequent observed transmission is different. Accordingly in the various embodiments, it is possible to use two buffers, one (Buffer 1) to store the first observed FACCH frame and a second buffer (Buffer 2) to sum the LLR's of subsequent observed frames as shown in FIG. 5.

Figure 5:
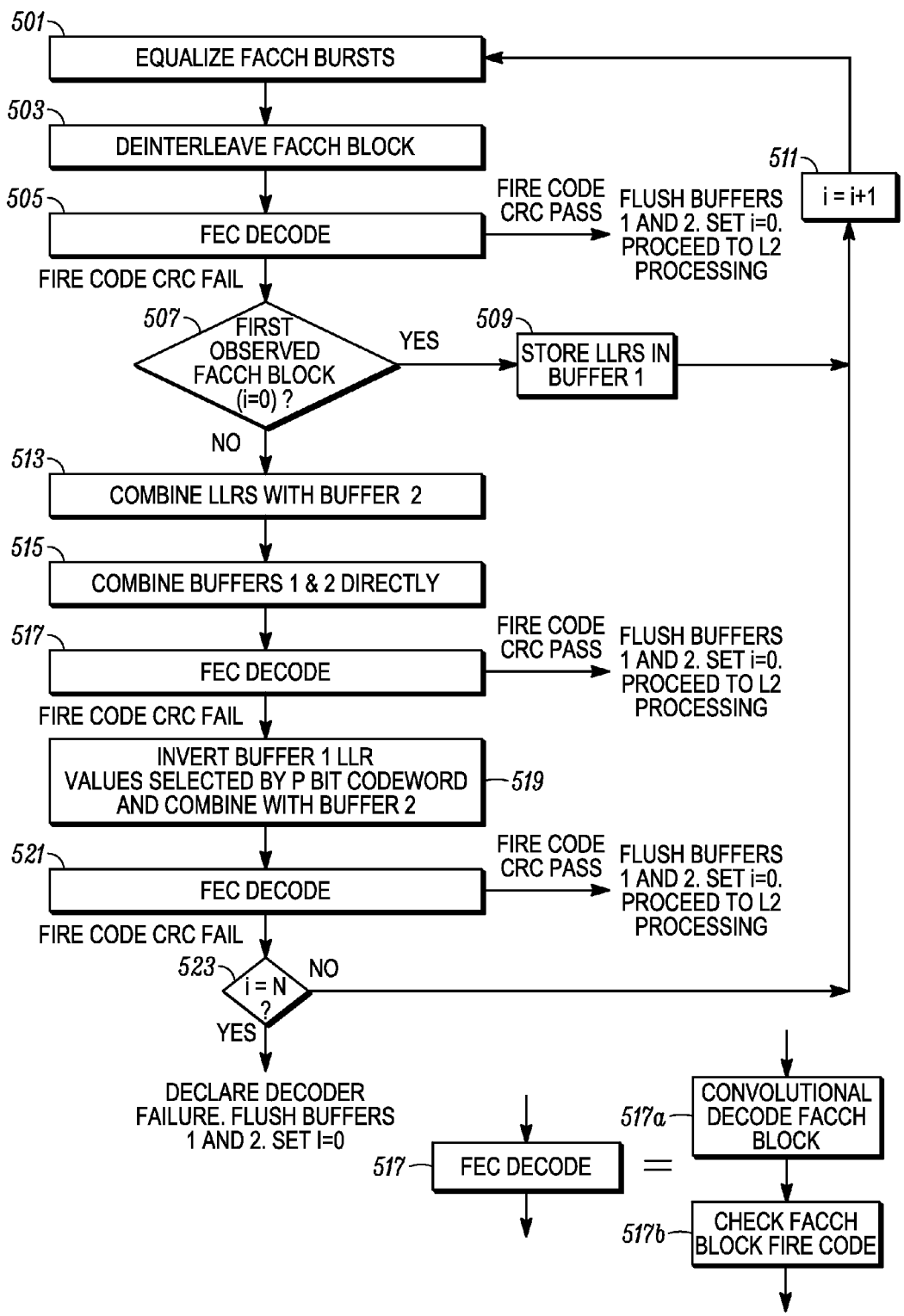
FIG. 5 is a flow diagram illustrating a decoding scheme in accordance with various embodiments.

In the embodiments illustrated by FIG. 5, two decoding hypotheses are required only; a first where the two buffers are combined directly as shown in block 513 and a second where the P codeword bit LLR's of Buffer 1 are inverted before combining with those of Buffer 2 and shown in block 519. A maximum of N transmissions is allowed by the receiver, as shown in block 523, after which a decoding failure is declared.

It is to be noted that equation (0.4) as described above, and with respect to the various embodiments, provides for particularly efficient combining of first and subsequent codeword observations and subsequent forward error correction decoding of the resulting combined code word observations by exploiting the properties of linear codes.

However, the present disclosure is not so limited, and it is to be understood that other methods of jointly decoding the first and subsequent codeword observations are equally applicable to the various embodiments herein disclosed. For example, a simple convolutional decoder based on the Viterbi decoding principle could be modified to operate on the first and subsequent codeword observations by embedding hypotheses on the information word differences between the first and subsequent codeword observations, such as on the P bit in the particular case of the FACCH transmission, in the branch metric computations used to construct the trellis state metrics. Therefore in some embodiments, each particular hypothesis regarding the difference in information words may be associated with the already well-known hypotheses embedded in the Viterbi decoder regarding the encoded bits delimiting each state transition in the trellis.

In the particular case where the function $f(\bullet)$ in equation (0.1) is a non-linear code, combining methods exploiting the linear code property of equation (0.4) may not be applicable, and such alternative methods of joint decoding may be required.

It is to be noted that various other embodiments for joint decoding exist in accordance with the present disclosure. For example, in some embodiments, joint decoding may make use of a priori known differences in messages in a probabilistic fashion, noting that for "Soft-Input, Soft-Output" (SISO) decoders, a portion of the probabilistic values corresponding to the codeword bits, whether input or output to the SISO decoder, correspond to the a priori known message difference. Therefore, handling may be applied to such bit portions such that an initial and subsequent message may be jointly decoded.

It is to be understood that, although the messages are described for simplicity as "initial" and "subsequent," such messages may not necessarily be transmitted at initial and subsequent times in all embodiments. For example, in some embodiments a set of messages with known differences in information content may be sent over a multiplicity of channels, where these channels may be time-division, frequency division or code-division multiplexed, or mapped in some other fashion onto a set of physical resources, such as Orthogonal Frequency Division Modulation (OFDM) sub-carriers. All that is required is that the receiver be aware of the differences in information word content, and the method of forward error correction encoding. In such instances, the messages may then be jointly decoded using for example, linear or SISO decoder embodiments. Further with respect to subsequent messages wherein such messages do arrive at times subsequent to an initial message, no particular time interval or spacing is required by the various embodiments.

It is to be understood that much of the inventive functionality and many of the inventive principles herein disclosed are best implemented with or in software or firmware programs or instructions and integrated circuits (ICs) such as digital signal processors (DSPs) or application specific ICs (ASICs)

as is well known by those of ordinary skill in the art. Therefore, further discussion of such software, firmware and ICs, if any, will be limited to the essentials with respect to the principles and concepts used by the various embodiments.

The FACCH decoding methods herein disclosed are defined in the context of a voice call using a single timeslot per TDMA frame. Therefore, the MIPS (millions of instructions per second) and memory constraints are less restrictive than for the multi-slot case. Nonetheless, neglecting the cost of combining LLRs, the computational complexity of decoding (convolutional and Fire decoding) is doubled in some embodiments due to the need to hypothesize the first observed FACCH block which may or may not be the actual first transmission. Therefore, with respect to the memory requirements of some embodiments, two buffers of 456 words of 16 bits must be allocated to store LLR values between the reception of subsequent FACCH frames.

FIG. 6 illustrates high level operation of the various embodiments in a simplified manner. A first message is received and demodulated in block 601 to obtain a first set of LLRs, or array $LLR_1$. A second message is likewise received and demodulated as shown in block 603 to obtain a second set of LLRs, or array $LLR_2$. The magnitude of the thereby obtained LLR arrays are ideally equal assuming similar interfering noise for the first and second received messages.

Therefore, turning briefly to FIG. 7, a range 703 may be determined for which the first and second received messages may be considered identical. If for example, $$A = \sum_{i \in \Omega} |LLR_{1,i}|,$$

$$B = \sum_{i \in \Omega} |LLR_{2,i}|, \text{ and}$$

$$C = \sum_{i \in \Omega} |LLR_{1,i} + LLR_{2,i}|,$$

then $C \cong A+B$ when the first and second messages are identical and $C \cong \Sigma(||LLR_1|-|LLR_2||)$ when each bit in the first message is the opposite to that of the second message. In general, when both messages are different, it is reasonable to assume that half of the message bits are the same and half are different. This may be indicated when C has a value close to the midpoint 705 of the range described in FIG. 7.

Therefore, ranges 703 and 706 of FIG. 7 may be used to indicate that the received messages are identical. More particularly in some embodiments, values of C that fall within a smaller region defined by the region 703 threshold 704 and (A+B) may be considered to indicate identical messages. Messages with C values between the 703 region threshold 704 and $\Sigma(||LLR_1-LLR_2||)$ may be considered to be different. Note that the threshold 704 may vary depending on various secondary parameters such as performance statistics related to equalization, such as training sequence error, or to logical channel type, etc.

Note that a subset $\Omega$ of message codeword LLR values over which metrics A, B, C etc. are computed may comprise any suitable subset of message codeword bits in the various embodiments. For example, $\Omega$ may comprise the entire message codeword, or only those bits in the message codeword whose value is not influenced by the value of P.

Similarly, a range of FIG. 7 may be used to determine when the P bit has changed between a first and second message. By taking a portion of bits wherein the P-bit may be different (that is, by forming metrics A, B, C over a modified subset $\Omega$ of the message codeword, where $\Omega$ may be the complement of the first subset, or may be any other suitable subset), the maximum, minimum and C values may be computed for this portion similar to what was described above with respect to the entire message. Note that the message portions may correspond to the basic codeword $c_0(x)$ and the P-bit codeword $p(x)$ as defined by Equations (0.3) and (0.4) above. Here, a C value greater than the overall midpoint 705 may be considered to indicate that the P-bit is the same, while a C value corresponding to the region 706 may be considered to indicate different P-bits. Note again, however, that a threshold T may be applied in place of midpoint 705.

Therefore, various implementations may be used in the various embodiments falling within the scope of the present disclosure. For example, some embodiments may only check for differences in the P-bit, while other embodiments may only check whether the overall message is different. Likewise, both the overall message and the P-bit may be checked in some embodiments.

It is to be understood that one skilled in the art may choose to apply a similar procedure utilizing a suitable threshold instead of the overall midpoint 705 or may perform a different form of algebraic computation in calculating C and the ranges in FIG. 7 such as correlating the LLR values instead of adding them and taking their absolute value.

Further, it is to be understood that while the present disclosure discusses checking the P-bit of a FACCH because the P-bit is a known difference between subsequent FACCH transmissions, the present disclosure is not so limited. Rather, the present disclosure is applicable to any situation wherein subsequent transmissions comprise a known difference in messages between an initial and the subsequent transmissions. Therefore, messages other than FACCH with known differences other than a P-bit may be decoded and combined using the various embodiments herein disclosed.

Returning therefore to FIG. 6, if the messages are determined to be different as shown in block 605, the next message may be received again in block 603 and checked for difference. However, if it is determined that there is no difference between the messages, then the messages may be checked to determine whether the P bit value has changed as shown in block 607. If the P-bit has not changed then the LLRs may be combined as shown in block 611 and decoded as shown in block 613.

However, if the P bit has changed, then the LLR values corresponding to the P bit may be negated as shown in block 609 prior to combining in block 613.

Figure 8:
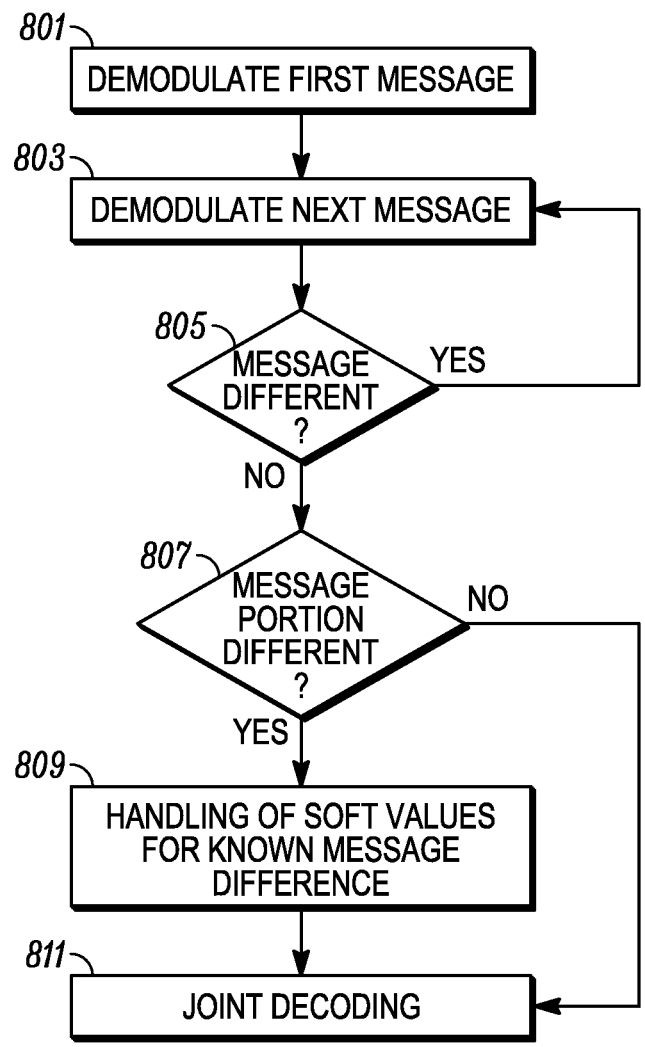
FIG. 8 is a flow diagram illustrating a high level operation in accordance with the various embodiments including some embodiments additional to those illustrated by FIG. 5.

Turning now to FIG. 8, a high level operation in accordance with embodiments utilizing generalized joint decoders or probabilistic methods such as SISO decoders is illustrated. Similar to FIG. 6, a first and second message is decoded as shown in blocks 801 and 803, respectively.

Block 805 represents the determination of whether the messages are different, while block 807 represents the determination of whether a portion of the message is different. Note that for the FACCH embodiments described in detail above, this portion would correspond to the P-bit which is known to change between FACCH transmissions. However, any transmission of interest having such a known difference may employ the embodiments illustrated by FIG. 8.

Block 809 represents handling of the probabilistic values corresponding to the codeword bit portion or portions, for a priori known message differences, as discussed above, whether input or output to the SISO decoder. One example therefore, is LLRs, wherein certain LLRs corresponding to known message differences may be negated prior to decoding.

However, important to understanding the embodiments illustrated by FIG. 8 is that messages with known differences detected in blocks 805 and 807 may be jointly decoded as shown in block 811. Therefore, in other exemplary embodiments, decoder outputs may be averaged as averages of the respective bit probabilities. Values corresponding to the message differences may simply be discarded in some embodiments prior to combining or otherwise determining decoder output vectors.

The various embodiments illustrated by FIG. 5 may be further extended from systems employing a protocol similar to that of FIG. 1, to protocols that permit transmission of a second, or additional, message prior to expiry of the T200 or some similar counter. Therefore in some embodiments, the entire flow chart of FIG. 5 may represent a single instance corresponding to a distinct message 'in flight' at any instant in time (before an uplink acknowledgement of the applicable message) wherein multiple messages may be transmitted.

Figure 9:
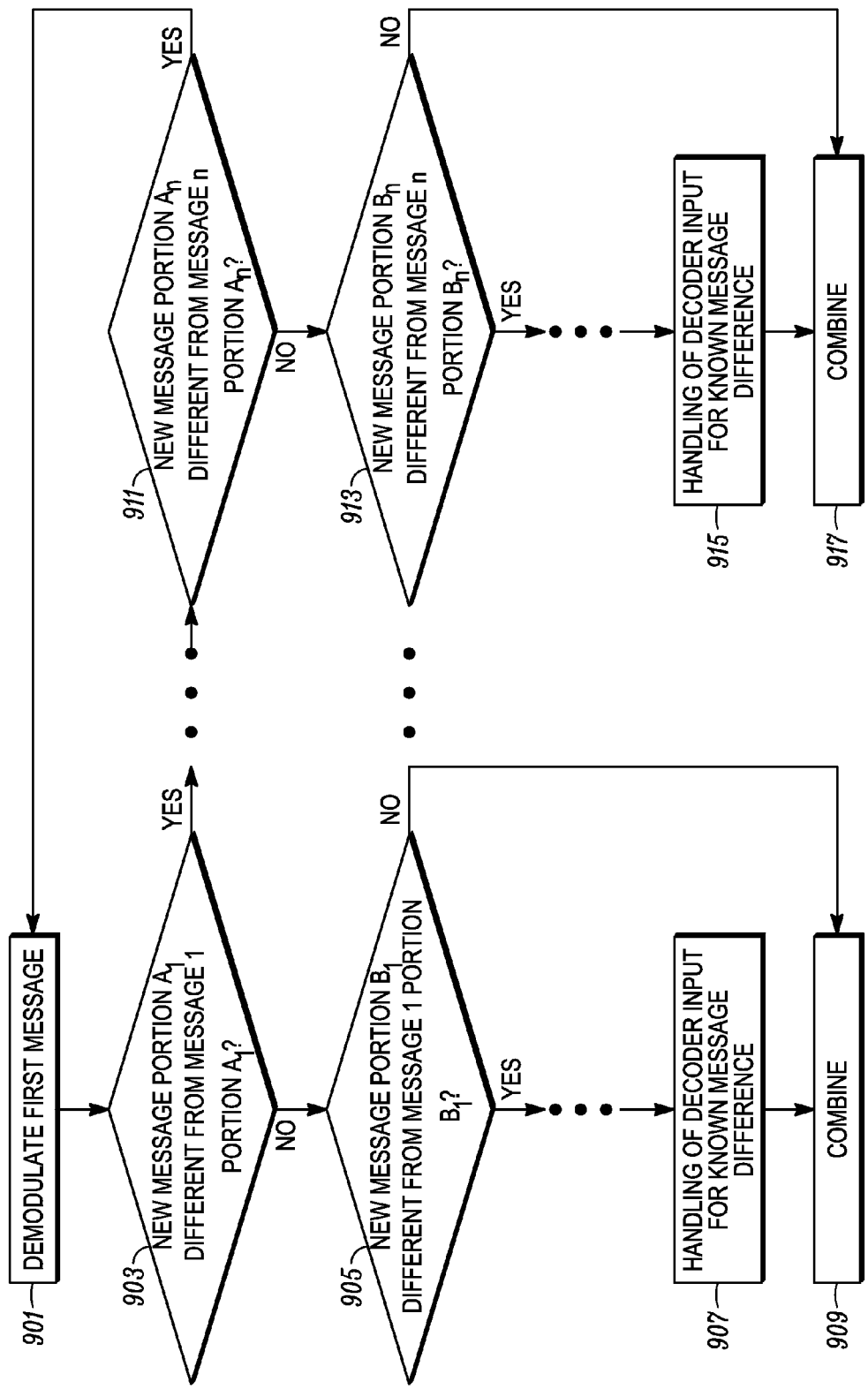
FIG. 9 is a flow diagram illustrating a high level operation in accordance with the various embodiments including some embodiments additional to those illustrated by FIG. 5 and FIG. 8.

FIG. 9 illustrates high level operation of how such embodiments may be extended for N processes. Blocks 903 and 911 represent the determination of whether portion A1 or AN of a New Message is the same as portion A1 or AN of a stored Message 1 or Message N, respectively. Blocks 905 and 913 represent the determination of whether portion B1 or BN of the New Message is the same as portion B1 or BN of the stored Message 1 or Message N, respectively. Note that for embodiments related to the FACCH, B1 through BN may correspond to the P-bit which is known to change between FACCH transmissions.

Any number of bits, and/or portions of messages may be processed as illustrated by FIG. 9, for any number of instances, prior to handling of decoder inputs for known message differences as shown in blocks 907 and 917. Further, various layers or sub-portions may be checked depending on the desired level of accuracy or granularity. Further, a mechanism for determining when to stop the process prior to blocks 907 and 915, or otherwise prior to blocks 909 and 917, such as allowing for a number of decoding failures before the declaring the process completed.

While various embodiments have been illustrated and described, it is to be understood that the disclosure is not so limited. Numerous modifications, changes, variations, substitutions and equivalents will occur to those skilled in the art without departing from the spirit and scope as defined by the appended claims.

The invention claimed is:

1. A method of operating a receiver comprising:
receiving a first codeword of a first message as part of a first transmission, the first message corresponding to data prior to being encoded for transmission;
receiving a second codeword of a second message as part of a second transmission, the second message corresponding to the data prior to being encoded for transmission, the second message having a known difference from said first message, where said difference includes a value which changes between the first message and the second message;
hypothesizing said difference in the value which changes between said first message and said second message, wherein hypothesizing said difference includes hypothesizing that at least one bit is different between said first message and said second message;
determining a hypothesized difference between the first codeword and the second codeword, based upon the hypothesized difference between the first message and the second message; and
jointly decoding the first codeword of the first message and the second codeword of the second message utilizing said determined hypothesized difference between the first codeword and the second codeword.

2. The method of claim 1, wherein the step of hypothesizing said difference further comprises:
initially hypothesizing that said first message and said second message are identical, prior to said jointly decoding; and
subsequently hypothesizing that at least one bit is different between said first message and said second message, prior to said jointly decoding.

3. The method of claim 1, wherein the step of hypothesizing said difference further comprises:
initially hypothesizing that at least one bit is different between said first message and said second message, prior to said jointly decoding; and
subsequently hypothesizing that said first message and said second message are identical, prior to said jointly decoding.

4. The method of claim 1, further comprising:
performing an arithmetic operation with a first set of probabilistic values corresponding to said first codeword,
a second set of probabilistic values corresponding to said second codeword, and
said known difference, prior to said jointly decoding.

5. The method of claim 1, further comprising:
performing an arithmetic operation with a first set of probabilistic values corresponding to said first codeword,
a second set of probabilistic values corresponding to said second codeword, and
said known difference, subsequent to said jointly decoding.

6. The method of claim 1, further comprising:
decoding said first codeword and said second codeword using a convolutional decoder and a Fire decoder.

7. The method of claim 1 further comprising:
deriving a first decoder input component from said first codeword wherein said first codeword has a linear encoding;
deriving a second decoder input component from said second codeword wherein said second codeword has said linear encoding; and
modifying a portion of said second decoder input component based on said hypothesizing said difference, and said linear encoding.

8. The method of claim 7, wherein the step of modifying a portion of said second decoder input component based on said hypothesizing said difference, and said linear encoding, further comprises:
negating said portion of said second decoder input component.

9. The method of claim 8, wherein said first decoder input component is a first set of log likelihood ratio values and said second decoder input component is a second set of log likelihood ratio values, further comprising:
combining said first set of log likelihood ratio values with said second set of log likelihood ratio values to obtain a combined decoder input.

10. The method of claim 9, further comprising:
inputting said combined decoder input to a convolutional decoder and a Fire decoder.

11. A wireless receiver comprising:
a demodulation circuitry configured to demodulate a first codeword of a first message, the first message corresponding to data prior to being encoded for transmission, and a second codeword of a second message, the second message corresponding to the data prior to being encoded for transmission, the second message having a known difference from said first message, where said difference includes a value which changes between the first message and the second message;

a decoding circuitry coupled to said demodulation circuitry configured to:

hypothesize said difference in the value which changes between said first message and said second message, wherein hypothesizing said difference includes hypothesizing that at least one bit is different between said first message and said second message;

determine a hypothesized difference between the first codeword and the second codeword, based upon the hypothesized difference between the first message and the second message; and jointly decode the first codeword of said first message and the second codeword o5 said second message using said determined hypothesized difference between the first codeword and the second codeword.

12. The wireless receiver of claim 11, wherein said decoding circuitry is further configured to:

initially hypothesize that said first message and said second message are identical; and subsequently hypothesize that at least one bit is different between said first message and said second message.

13. The wireless receiver of claim 11, wherein said decoding circuitry is further configured to:

initially hypothesize that at least one bit is different between said first message and said second message; and subsequently hypothesize that said first message and said second message are identical.

14. The wireless receiver of claim 11, wherein said decoding circuitry is further configured to perform an arithmetic operation with a first set of probabilistic values corresponding to the first codeword of said first message, a second set of probabilistic values corresponding to the second codeword of said second message, and said known difference, prior to said jointly decoding.

15. The wireless receiver of claim 11, wherein said decoding circuitry is further configured to perform an arithmetic operation with a first set of probabilistic values corresponding to the first codeword of said first message, a second set of probabilistic values corresponding to the second codeword of said second message, and said known difference, subsequent to said jointly decoding.

16. The wireless receiver of claim 11, further comprising:

a first memory buffer coupled to said decoding circuitry configured to store data associated with said first message; and a second memory buffer coupled to said decoding circuitry configure to store data associated with said second message.

17. The wireless receiver of claim 16, wherein said decoding circuitry further comprises:

a first decoding circuitry; and a second decoding circuitry coupled to said first decoding circuitry.

18. The wireless receive of claim 17, wherein said first decoding circuitry is a convolutional decoder and said second decoding circuitry is a Fire decoder.

19. The method of claim 1, wherein each message includes a plurality of bits each having a value, and wherein the value which can change between the first message and the second message includes the value of at least one of the plurality of bits.

* * * * *